United States Patent
Bojarczuk et al.

(10) Patent No.: US 9,287,426 B1
(45) Date of Patent: Mar. 15, 2016

(54) EPITAXIAL GROWTH OF CZT(S,SE) ON SILICON

(71) Applicant: International Business Machines Corporation, Armonk, NY (US)

(72) Inventors: Nestor A. Bojarczuk, Poughkeepsie, NY (US); Talia S. Gershon, White Plains, NY (US); Supratik Guha, Chappaqua, NY (US); Byungha Shin, Daejeon (KR); Yu Zhu, West Harrison, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/499,788

(22) Filed: Sep. 29, 2014

(51) Int. Cl.
*H01L 31/18* (2006.01)
*H01L 31/032* (2006.01)
*H01L 31/0368* (2006.01)

(52) U.S. Cl.
CPC ........ *H01L 31/0326* (2013.01); *H01L 31/0368* (2013.01); *H01L 31/18* (2013.01)

(58) Field of Classification Search
CPC ............ H01L 31/02008; H01L 31/032; H01L 31/0326; H01L 13/18; H01L 13/0368
See application file for complete search history.

(56) References Cited

U.S. PATENT DOCUMENTS

| 8,097,885 | B2 | 1/2012 | Oike et al. | |
|---|---|---|---|---|
| 2004/0011280 | A1* | 1/2004 | Higuchi et al. | 117/97 |
| 2009/0236595 | A1* | 9/2009 | Atanackovic | 257/43 |
| 2011/0263072 | A1 | 10/2011 | Lee et al. | |
| 2012/0100663 | A1* | 4/2012 | Bojarczuk et al. | 438/73 |
| 2012/0279565 | A1 | 11/2012 | Mitzi et al. | |
| 2013/0025658 | A1 | 1/2013 | Bedell et al. | |
| 2013/0217175 | A1 | 8/2013 | Chawla et al. | |

OTHER PUBLICATIONS

Clas Persson, "Electronic and optical properties of Cu2ZnSnS4 and Cu2ZnSnSe4," Journal of Applied Physics 107, 053710 (Mar. 2010).

Mitzi et al., "The path towards a high-performance solution-processed kesterite solar cell," Solar Energy Materials & Solar Cells 95 (Jan. 2011) 1421-1436.

(Continued)

*Primary Examiner* — Whitney T Moore
(74) *Attorney, Agent, or Firm* — Vazken Alexanian; Michael J. Chang, LLC (57) ABSTRACT

Techniques for epitaxial growth of CZT(S,Se) materials on Si are provided. In one aspect, a method of forming an epitaxial kesterite material is provided which includes the steps of: selecting a Si substrate based on a crystallographic orientation of the Si substrate; forming an epitaxial oxide interlayer on the Si substrate to enhance wettability of the epitaxial kesterite material on the Si substrate, wherein the epitaxial oxide interlayer is formed from a material that is lattice-matched to Si; and forming the epitaxial kesterite material on a side of the epitaxial oxide interlayer opposite the Si substrate, wherein the epitaxial kesterite material includes Cu, Zn, Sn, and at least one of S and Se, and wherein a crystallographic orientation of the epitaxial kesterite material is based on the crystallographic orientation of the Si substrate. A method of forming an epitaxial kesterite-based photovoltaic device and an epitaxial kesterite-based device are also provided.

20 Claims, 3 Drawing Sheets

(56) References Cited

OTHER PUBLICATIONS

A. Weber et al., "On the Sn loss from thin films of the material system Cu—Zn—Sn—S in high vacuum," Journal of Applied Physics 107, 013516 (Jan. 2010).

K. Oishi et al., "Growth of Cu2ZnSnS4 thin films on Si (100) substrates by multisource evaporation," Thin Solid Films, vol. 517, No. 4, Sep. 2008, pp. 1449-1452.

H.F. Lui et al., "Growth of high quality Cu2ZnSnS4 thin films on GaN by co-evaporation," 35th IEEE Photovoltaic Specialists Conference (PVSC), Jun. 2010, pp. 001977-001981.

K. Sekiguchi et al., "Epitaxial growth of Cu2ZnSnS4 thin films by pulsed laser deposition," Physics Status Solidi (c), vol. 3, No. 8, Sep. 2006, pp. 2618-2621.

T. Tanaka et al., "Existence and removal of Cu2Se second phase in coevaporated Cu2ZnSnSe4 thin films," Journal of Applied Physics, vol. 111, Mar. 2012, 053522.

N. Song et al., "Effects of Substrate Orientation and Post Sulfurization Annealing on the Properties of Single Target Sputtered Cu2ZnSnS4 Thin Films on Si Substrates for Tandem Solar Cells," 28th European Photovoltaic Solar Energy Conference and Exhibition, Sep. 30-Oct. 4, 2013, Abstract/Summary.

* cited by examiner

CZTS/Si(111)

FIG. 8

CZTS/Er2O3/
Si(111)

Uncovered
Si
substrate

CZT(S,Se)
grain

FIG. 9

EPITAXIAL GROWTH OF CZT(S,SE) ON SILICON

STATEMENT OF GOVERNMENT RIGHTS

This invention was made with Government support under Contract number DE-EE0006334 awarded by Department of Energy. The Government has certain rights in this invention.

FIELD OF THE INVENTION

The present invention relates to epitaxial CZT(S,Se) materials and more particularly, to epitaxial growth of CZT(S,Se) materials on silicon (Si) including techniques for controlling CZT(S,Se) crystallographic orientation and for enhancing wettability of the CZT(S,Se) on Si using a thin film epitaxial oxide interlayer.

BACKGROUND OF THE INVENTION

Kesterite materials, such as those containing copper (Cu), zinc (Zn), tin (Sn) and at least one of sulfur (S) and selenium (Se) (abbreviated herein as "CZT(S,Se)"), are inexpensive and earth-abundant. CZT(S,Se) is of current interest for use as a solar cell absorber material.

The most common form of CZT(S,Se) in high efficiency solar devices is polycrystalline. While the role of grain boundaries is not well understood, it is thought that grain boundaries in polycrystalline CZT(S,Se) absorber materials can undesirably lead to voltage problems in solar devices.

Thus, solar devices employing grain boundary-free forms of CZTS would be desirable.

SUMMARY OF THE INVENTION

The present invention provides techniques for epitaxial growth of CZT(S,Se) materials on silicon (Si) including techniques for controlling CZT(S,Se) crystallographic orientation and for enhancing wettability of the CZT(S,Se) using a thin film epitaxial oxide interlayer. In one aspect of the invention, a method of forming an epitaxial kesterite material is provided. The method includes the steps of: selecting a Si substrate based on a crystallographic orientation of the Si substrate; forming an epitaxial oxide interlayer on the Si substrate to enhance wettability of the epitaxial kesterite material on the Si substrate, wherein the epitaxial oxide interlayer is formed from a material that is lattice-matched to Si; and forming the epitaxial kesterite material on a side of the epitaxial oxide interlayer opposite the Si substrate, wherein the epitaxial kesterite material includes copper (Cu), zinc (Zn), tin (Sn), and at least one of sulfur (S) and selenium (Se), and wherein a crystallographic orientation of the epitaxial kesterite material is based on the crystallographic orientation of the Si substrate.

In another aspect of the invention, a method of forming an epitaxial kesterite-based photovoltaic device is provided. The method includes the steps of: selecting a Si substrate based on a crystallographic orientation of the Si substrate; forming an epitaxial kesterite material on the Si substrate which serves as an absorber layer of the photovoltaic device, wherein the epitaxial kesterite material includes Cu, Zn, Sn, and at least one of S and Se, and wherein a crystallographic orientation of the epitaxial kesterite material is based on the crystallographic orientation of the Si substrate; forming a buffer layer on a side of the epitaxial kesterite material opposite the Si substrate; and forming a transparent front contact on a side of the buffer layer opposite the epitaxial kesterite material.

In yet another aspect of the invention, an epitaxial kesterite-based device is provided. The epitaxial kesterite-based device includes: a Si substrate; an epitaxial oxide interlayer on the Si substrate, wherein the epitaxial oxide interlayer is formed from a material that is lattice-matched to Si; and an epitaxial kesterite material on a side of the epitaxial oxide interlayer opposite the Si substrate, wherein the epitaxial oxide interlayer serves to enhance wettability of the epitaxial kesterite material on the Si substrate, wherein the epitaxial kesterite material includes Cu, Zn, Sn, and at least one of S and Se, and wherein a crystallographic orientation of the epitaxial kesterite material is based on the crystallographic orientation of the Si substrate.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for producing grain boundary-free epitaxial CZT(S,Se) materials on silicon (Si) substrates. As provided above, CZT(S,Se) materials are kesterites containing copper (Cu), zinc (Zn), tin (Sn), and at least one of sulfur (S) and selenium (Se). Epitaxy involves the growth of a crystalline material (in this case CZT(S,Se)) on a crystalline substrate (in this case a Si substrate). To be epitaxial, the atoms in the growing film must align themselves with those in the substrate so as to form a continuous atomic arrangement across the interface (i.e., the atomic planes in the film are a continuation of the atomic planes in the substrate).

Grain boundaries are the interfaces between grains in a polycrystalline material and have been correlated with recombination in other polycrystalline material systems. Grain boundaries in a CZT(S,Se) material are undesirable as they are thought to impede carrier mobility and/or introduce recombination centers, thus affecting the operation of corresponding polycrystalline CZT(S,Se)-based devices. The present epitaxial CZT(S,Se) materials on the other hand generally have a much lower density of two-dimensional boundaries and can be free of grain boundaries. This is based on the nature of the epitaxial growth process employed herein. Specifically, as will be described in detail below, formation of the present epitaxial CZT(S,Se) material involves heating the substrate to a high temperature (examples provided below) which gives the Cu, Zn, Sn, and S and/or Se atoms sufficient kinetic energy to find the perfect crystallographic lattice site for each atom. The result is the formation of larger crystallites with fewer two-dimensional boundaries. Therefore, the problems associated with two-dimensional boundaries such as grain boundaries can be largely avoided. As will be described in detail below, the present techniques involve epitaxial growth of CZT(S,Se) on a lattice-matched substrate such as Si.

Further, during epitaxy CZT(S,Se) does not cover the substrate well. Specifically, if deposited directly onto a Si substrate, epitaxial CZT(S,Se) tends to cover some areas while leaving others bare, resulting in voids in the solid layer. According to the present techniques, a thin film oxide interlayer may be used to enhance wettability of the CZT(S,Se) on the Si substrate. The oxide interlayer is also epitaxial in order to insure lattice matching between the Si substrate and the CZT(S,Se). While beneficial, it is notable that use of the oxide interlayer is optional. Namely, if grown thick enough, the originally-isolated CZT(S,Se) islands will eventually merge into a single solid layer. Ideally however, wettability is improved without changing film thickness. This can be achieved through the use of the present epitaxial oxide interlayer.

Any surfaces of the Si substrate exposed during the epitaxial CZT(S,Se) growth process can be subject to sulfur etching. Specifically, silicon sulfide (Si—S) is a volatile compound at the temperatures used herein to grow the CZT(S,Se) on Si. Thus, Si can be lost in the form of Si—S during deposition. As provided above, sulfur may be a component of the CZT(S,Se). Sulfur etching is undesirable since regions of the substrate surface which have been sulfur etched will not allow uniform nucleation of CZT(S,Se). Thus, another notable advantage to use of the present oxide interlayer is that it physically covers and protects the Si substrate from sulfur etching.

Figures 1, 2:
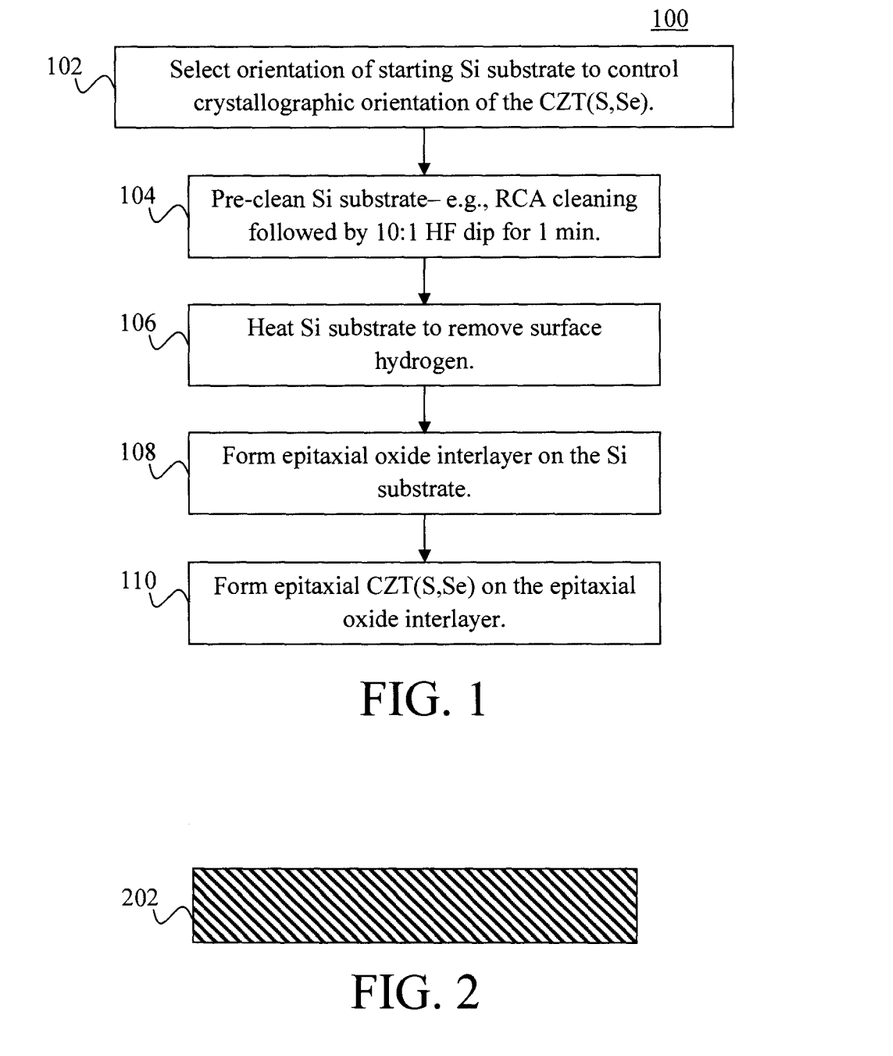
FIG. 1 is a diagram illustrating an exemplary methodology for forming an epitaxial CZT(S,Se) material on a silicon (Si) substrate according to an embodiment of the present invention.
FIG. 2 is a cross-sectional diagram illustrating a starting structure (e.g., a Si substrate) for an exemplary implementation of the present techniques to form an epitaxial CZT(S,Se)-based photovoltaic device according to an embodiment of the present invention.

An overview of the present techniques is now provided by way of reference to methodology 100 of FIG. 1. As provided above, the starting structure for the process is a Si substrate. Unless otherwise noted, the Si substrates employed herein are mono-crystalline Si substrates. Further, the Si substrate can be one of multiple layers present. Thus the starting Si substrate can be, for example, the top layer of a multi-layer stack (i.e., a multi-layer stack wherein the top layer is a (mono-crystalline) Si layer). Si is lattice matched to CZT(S,Se) and thus is an ideal substrate for epitaxial CZT(S,Se) growth. The term "lattice-matched" as used herein refers generally to the condition where two materials have the same, or very similar (within 5% difference), lattice constants as one another. Lattice-matching ensures that the growth is epitaxial (see above) and that structural defects such as dislocations in the growing thin film are kept to a minimum. As is known in the art, lattice constants denote the physical dimensions of a crystal (e.g., a crystal in three-dimensions typically has three lattice constants a, b, and c). The lattice constants of two materials do not have to match up exactly for the materials to be lattice-matched. According to the present techniques, materials having up to a 5% mismatch in their lattice constants are still considered herein to be lattice-matched to one another. For instance, the lattice constants a, b, and/or c of a first material may each differ by up to about 5% from the lattice constants a, b, and/or c, respectively, of a second material yet the first and second materials are considered herein to be lattice-matched. Lattice mismatches greater than 5% introduce an unacceptably high level of strain into the epitaxial material which inevitably leads to structural defects such as dislocations.

The crystallographic orientation of the CZT(S,Se) can advantageously be controlled by the crystallographic orientation of the starting Si substrate. By way of example only, starting with a Si(001) substrate, epitaxial CZT(S,Se)(004)/(200) and CZTS,Se(008)/(400) are produced. By comparison, starting with a Si(111) substrate epitaxial CZT(S,Se) (112) is produced. See FIGS. 7A and 7B, described below. The atomic plane of a crystal can be denoted using three value notations known as miller indices (e.g., (001), (200), etc.). In the instant case, the miller indices used designate the atomic plane in a Si or CZT(S,Se) crystal. From "(004)" for example, an atomic plane can be visualized that intersects the x, y, z axes at infinity for x and y and ¼ of the unit cell in the "z" direction, i.e., at the reciprocal of the "miller indices." In contrast, "(200)" represents an atomic plane that intersects the unit cell at ½ in the x direction and infinity in y and z.

The CZT(S,Se) crystal structure is anisotropic, i.e., not isotropic. Thus if a, b, and c represent the lattice constants in the x, y, and z directions, respectively, then in CZT(S,Se) a=b≠c, where c is larger than a and b by approximately 2×. If the CZT(S,Se) crystal is oriented so that its "c" axis is perpendicular to the substrate, the planes will be arranged differently than if the c-axis is parallel to the substrate. Both orientations of CZT(S,Se) on Si (i.e., where the CZT(S,Se) c-axis is perpendicular or parallel to the underlying Si substrate) are possible and expected to form. The (004) plane from the regions of material with a c-axis perpendicular to the Si and the (200) plane from the regions of material with a c-axis parallel to the Si are indistinguishable in the diffraction pattern. Thus, the corresponding peak is labeled herein with both sets of indices (e.g., "(004)/(200)").

Thus, in step 102, the starting Si substrate is selected based on its crystallographic orientation (e.g., either Si(001) or Si(111)) so as to control the crystallographic orientation of the CZT(S,Se). It is advantageous to be able to control the crystallographic orientation of the CZT(S,Se) because different crystallographic orientations can yield different properties in the material. For instance, with "anisotropic" materials (like CZT(S,Se), where some of the atomic planes are polar and some are non-polar), different surface properties can be obtained depending on what orientation the crystal has (resulting in either a non-polar or a polar surface). Other times, carrier transport is better/worse in some crystallographic directions compared to others. This is expected to be the case for CZT(S,Se) also. Usually, controlling crystal orientation is of special importance when material properties vary in different crystallographic directions. By way of example only, the carrier "effective mass" of kesterites such as CZT(S,Se) is thought to vary according to crystallographic direction. See, for example, Clas Persson, "Electronic and optical properties of $Cu_2ZnSnS_4$ and $Cu_2ZnSnSe_4$," Journal of Applied Physics 107, 053710 (2010) (hereinafter "Persson"), the contents of which are incorporated by reference as if fully set forth herein. The findings in Persson suggest that the effective mass is larger in the (001) direction, meaning that the mobility would be lower in this direction—a sign of worse transport. In that case, selection of the (111) direction would be preferable.

In step 104, a pre-clean of the Si substrate is performed. According to an exemplary embodiment, the pre-clean involves a standard RCA cleaning (to remove organic contaminants, oxides, and ionic or heavy metal contaminants from the substrate) followed by a hydrofluoric acid (HF) dip (e.g., in 10:1 $H_2O$:HF for 1 minute). The present coevaporation process for forming the epitaxial CZT(S,Se) (see below) will be carried out in a vacuum chamber. Thus, immediately after the HF dip, the Si substrate is transferred to a vacuum chamber.

In step 106, the Si substrate is preferably heated in the vacuum chamber to remove surface hydrogen from the pre-clean. According to an exemplary embodiment, the Si substrate is heated in step 104 to a temperature of from about 600 degrees Celsius (° C.) to about 750° C., and ranges therebetween.

In step 108, an epitaxial oxide interlayer is formed on the Si substrate. The epitaxial oxide interlayer is lattice-matched to both Si and CZT(S,Se). As provided above, while use of an epitaxial oxide interlayer is optional, the epitaxial oxide interlayer advantageously increases wettability of the epitaxial kesterite CZT(S,Se) on the Si substrate and prevents undesirable etching of the Si substrate surface by sulfur (from the CZT(S,Se) deposition process). As further provided above, the use of a thin epitaxial material for the oxide interlayer maintains lattice matching between the Si substrate and the CZT(S,Se).

Only a thin layer of the epitaxial oxide interlayer is needed to enhance wettability of the CZT(S,Se) on the Si substrate. By way of example only, in step 108 the epitaxial oxide interlayer is formed on the substrate to a thickness of from about 5 nanometers (nm) to about 30 nm, and ranges therebetween. Using a thin epitaxial oxide interlayer that is lattice-matched to both Si and CZT(S,Se) ensures that the CZT(S,Se) is still epitaxial to the underlying oxide interlayer/Si substrate. While thin, it is preferable that the epitaxial oxide interlayer fully/completely covers the surface of the Si substrate onto which the epitaxial CZT(S,Se) material will be deposited. In addition to increasing adherence of the epitaxial CZT(S,Se) to the Si substrate, an unbroken layer of the epitaxial oxide interlayer serves to protect the Si substrate against degradation by the sulfur in the CZT(S,Se). It is however notable that while an unbroken epitaxial oxide interlayer that fully covers the Si substrate is ideal in terms of protecting the Si substrate against sulfur degradation, it is not absolutely necessary for enhancing wettability. Specifically, a discontinuous layer of the epitaxial oxide interlayer will still serve to enhance wettability of the CZT(S,Se) on the Si substrate surface.

Thus, the oxide interlayer is formed from an epitaxial material that is lattice-matched to Si. Suitable materials for forming the epitaxial oxide interlayer include, but are not limited erbium oxide ($Er_2O_3$), lanthanum oxide ($La_2O_3$), or yttrium oxide ($Y_2O_3$). Epitaxial $Er_2O_3$, $La_2O_3$, and $Y_2O_3$ are all lattice-matched to Si. According to an exemplary embodiment, the epitaxial oxide interlayer is formed using an evaporation process in the vacuum chamber. By way of example only, the epitaxial oxide interlayer is formed on the Si substrate by evaporating a source material (e.g., $Er_2O_3$, $La_2O_3$, or $Y_2O_3$) in the vacuum chamber at a temperature of from about 500° C. to about 750° C., and ranges therebetween, at a reduced pressure of from about $1 \times 10^{-6}$ Torr to about $1 \times 10^{-9}$ Torr, and ranges therebetween.

In step 110, an epitaxial kesterite CZT(S,Se) layer is formed on a side of the epitaxial oxide interlayer opposite the Si substrate (or directly on the Si substrate if the (optional) epitaxial oxide interlayer is not present). As described above, the CZT(S,Se) layer is epitaxial to the underlying epitaxial oxide interlayer/Si substrate. Thus, the CZT(S,Se) will be relatively free from two-dimensional structural defects with a crystal structure templated from the underlying Si substrate.

According to an exemplary embodiment, the epitaxial kesterite CZT(S,Se) layer is formed on the epitaxial oxide interlayer (or directly on the Si substrate) by co-evaporating the source materials (e.g., Cu, Zn, Sn, and at least one of S and Se) in the vacuum chamber at a temperature of from about 350° C. to about 550° C., and ranges therebetween, at a reduced pressure of from about $1 \times 10^{-6}$ Torr to about $1 \times 10^{-9}$ Torr, and ranges therebetween. Since the epitaxial oxide interlayer and the epitaxial kesterite CZT(S,Se) layer may both be deposited onto the Si substrate in the vapor chamber, according to an exemplary embodiment both the epitaxial oxide interlayer and the epitaxial kesterite CZT(S,Se) layer are deposited in-situ, without removing the Si substrate from the vacuum chamber and without breaking vacuum between deposition of the layers.

Kesterite CZT(S,Se) materials contain a number of volatile components. For example, Zn, Sn, S and Se, are volatile at the temperatures employed during CZT(S,Se) productions. For instance, when kesterite samples are heated above 400° C., re-evaporation of Sn(S,Se) occurs causing desorption and loss of Sn from the samples. See, for example, Mitzi et al., "The path towards a high-performance solution-processed kesterite solar cell," Solar Energy Materials & Solar Cells 95 (January 2011) 1421-1436, the contents of which are incorporated by reference as if fully set forth herein. Thus, care must be taken to control the concentration of these volatile components during fabrication. It is notable that the Sn lost due to desorption is however generally not elemental Sn, but occurs primarily in the form of tin sulfide (SnS). See, for example, A. Weber et al., "On the Sn loss from thin films of the material system Cu—Zn—Sn—S in high vacuum," Journal of Applied Physics 107, 013516 (January 2010) (hereinafter "Weber"), the contents of which are incorporated by reference as if fully set forth herein. It has been found that carrying out high temperature anneals (even at temperatures of 550° C. or above) in a sulfur environment (e.g., $H_2S$) can thus mitigate the loss of Sn. See Weber. Additionally, the vapor pressure of elemental Zn is reasonably high at the substrate temperatures commonly employed for CZT(S,Se) deposition. Accordingly, the Zn, Sn, S, and Se fluxes are key controls for epitaxial growth of the epitaxial CZT(S,Se) material. Specifically, the fluxes of Zn, Sn, S, and Se are increased compared to that of Cu so as to ensure sufficient incorporation of these elements into the structure. The precise fluxes used depend on the substrate temperatures and therefore the rates at which these species are expected to be expelled from the material. Given the teachings provided herein, one skilled in the art would be able to, for a given set-up, adjust the Zn, Sn, S, and Se fluxes relative to one another and/or to that of the Cu to account for volatility. By way of example only, according to U.S. Patent Application Publication Number 2012/0100663 by Bojarczuk et al., entitled "Fabrication of CuZnSn (S,Se) Thin Film Solar Cell with Valve Controlled S and Se," the contents of which are incorporated as if fully set forth herein, the sources for one or more components of a kesterite material are placed in a vapor chamber along with a substrate, and thermal evaporation is used to co-evaporate the components onto the substrate. Advantageously, the S and Se fluxes can be precisely regulated (by introducing the S and Se to the vapor chamber from individual S and Se cracking cells).

Following deposition of the epitaxial kesterite CZT(S,Se) layer, the structure is then removed from the vacuum chamber. A brief cooling period can be employed prior to removing the structure from the chamber. Further processing may be then performed to create a functioning device. See, for example, the method described below that employs the present techniques to forming a photovoltaic device having an epitaxial kesterite CZT(S,Se) absorber layer.

An exemplary implementation of the present techniques to form an epitaxial kesterite CZT(S,Se)-based photovoltaic device is now described by way of reference to FIGS. 2-6. As shown in FIG. 2, the process begins with a Si substrate 202. As described in conjunction with the description of step 102 of methodology 100 (of FIG. 1) above, Si is lattice matched to CZT(S,Se) and thus is an ideal substrate for epitaxial CZT(S,Se) growth.

Further, the crystallographic orientation of the CZT(S,Se) can advantageously be controlled by the orientation of Si substrate 202. See, for example, FIGS. 7A and 7B, described below. According to an exemplary embodiment, Si substrate 202 is either a Si(001) or a Si(111) substrate.

Prior to placing the Si substrate 202 in a vacuum chamber, a pre-clean of the substrate is preferably performed. As described in conjunction with the description of step 104 of methodology 100 (of FIG. 1) above a standard RCA cleaning may be performed (to remove organic contaminants, oxides, and ionic or heavy metal contaminants from the substrate) followed by a HF dip (e.g., in 10:1 $H_2O$:HF for 1 minute). Immediately after the HF dip, the Si substrate is transferred to a vacuum chamber. The configuration of a vacuum chamber is well known to those of skill in the art. Thus, for ease and clarity of depiction, the vacuum chamber itself is not shown in the figures. As described in conjunction with the description of step 106 of methodology 100 (of FIG. 1) above, once the Si substrate 202 is placed in the vacuum chamber the Si substrate 202 is preferably heated (e.g., to a temperature of from about 600° C. to about 750° C., and ranges therebetween) to remove surface hydrogen from the pre-clean step.

Figure 3:
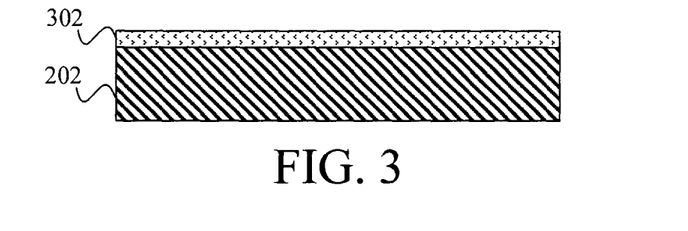
FIG. 3 is a cross-sectional diagram illustrating an epitaxial oxide interlayer having been deposited onto the Si substrate according to an embodiment of the present invention.

As shown in FIG. 3, an epitaxial oxide interlayer 302 is then deposited onto the Si substrate 202. The epitaxial oxide interlayer 302 is lattice-matched to both Si and CZT(S,Se). While use of an epitaxial oxide interlayer is optional, as provided above the epitaxial oxide interlayer advantageously increases wettability of the CZT(S,Se) on the Si substrate 202 and prevents undesirable sulfur etching of the Si substrate surface. According to an exemplary embodiment, the oxide interlayer 302 is formed from epitaxial $Er_2O_3$, $La_2O_3$, or $Y_2O_3$. While each of these epitaxial materials is lattice-matched to Si, it is still preferable that the epitaxial oxide interlayer 302 is thin (e.g., the oxide interlayer 302 is formed having a thickness of from about 5 nm to about 30 nm, and ranges therebetween). As noted above, while thin, it is preferable that the epitaxial oxide interlayer 302 fully covers the surface of the Si substrate onto which the epitaxial CZT(S,Se) material will be deposited. A solid layer of the epitaxial oxide interlayer serves to protect (as well as increase adherence to) the Si substrate against sulfur etching. While an unbroken epitaxial oxide interlayer that fully covers the Si substrate is ideal in terms of protecting the Si substrate against sulfur degradation, it is not absolutely necessary for enhancing wettability. Specifically, a discontinuous layer of the epitaxial oxide interlayer will still serve to enhance wettability of the CZT(S,Se) on the Si substrate surface.

As described in conjunction with the description of step 108 of methodology 100 (of FIG. 1) above the epitaxial oxide interlayer 302 can be formed in the vacuum chamber using an evaporation process. By way of example only, the epitaxial oxide interlayer 302 is formed on the Si substrate 202 by evaporating a source material (e.g., $Er_2O_3$, $La_2O_3$, or $Y_2O_3$) in the vacuum chamber at a temperature of from about 500° C. to about 750° C., and ranges therebetween, at a reduced pressure of from about $1 \times 10^{-6}$ Torr to about $1 \times 10^{-9}$ Torr, and ranges therebetween.

Figure 4:
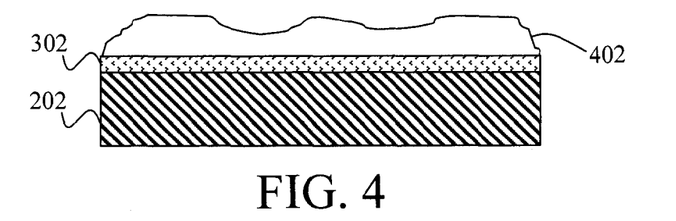
FIG. 4 is a cross-sectional diagram illustrating an epitaxial CZT(S,Se) layer having been formed on a side of the epitaxial oxide interlayer opposite the Si substrate according to an embodiment of the present invention.

As shown in FIG. 4, an epitaxial kesterite CZT(S,Se) layer 402 is then formed on a side of the epitaxial oxide interlayer 302 opposite the Si substrate 202 (or directly on the Si substrate 202 if the (optional) epitaxial oxide interlayer is not present). The epitaxial kesterite CZT(S,Se) layer 402 will serve as an absorber layer of the photovoltaic device. As described above, the kesterite CZT(S,Se) layer 402 is epitaxial to the underlying epitaxial oxide interlayer 302/Si substrate 202. Thus, the epitaxial kesterite CZT(S,Se) 402 will be relatively free from two-dimensional structural defects with a crystal structure templated from the underlying Si substrate 202.

As described in conjunction with the description of step 110 of methodology 100 (of FIG. 1) above the epitaxial kesterite CZT(S,Se) layer 402 can be formed on the epitaxial oxide interlayer 302 (or directly on the Si substrate 202) by co-evaporating the source materials (e.g., Cu, Zn, Sn, and at least one of S and Se) in the vacuum chamber at a temperature of from about 350° C. to about 550° C., and ranges therebetween, at a reduced pressure of from about $1 \times 10^{-6}$ Torr to about $1 \times 10^{-9}$ Torr, and ranges therebetween. As described above, the epitaxial oxide interlayer 302 and the epitaxial kesterite CZT(S,Se) layer 402 may be deposited in-situ, i.e., without removing the Si substrate 202 from the vacuum chamber and without breaking vacuum between deposition of these layers. As also described above, due to the volatility of Zn, Sn, and the chalcogen (i.e., S and Se) components at processing temperatures, care must be taken to control the fluxes of these volatile components during fabrication.

Following deposition of the epitaxial kesterite CZT(S,Se) layer 402, the structure is removed from the vacuum chamber. A brief cooling period can be employed prior to removing the structure from the chamber. Further processing may be then performed to complete the device. By way of example only, a buffer layer 502 may then be formed on a side of the epitaxial kesterite CZT(S,Se) layer 402 opposite the epitaxial oxide interlayer 302 (or if the epitaxial oxide interlayer 302 is not present the buffer layer 502 is formed on a side of the epitaxial kesterite CZT(S,Se) layer 402 opposite the Si substrate 202). See FIG. 5.

Figure 5:
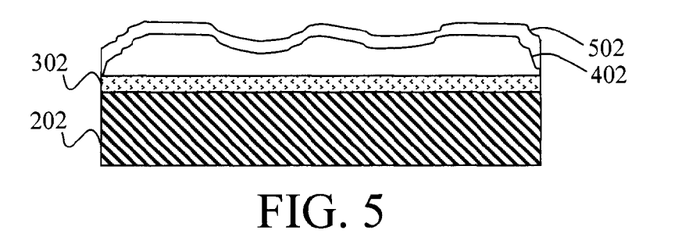
FIG. 5 is a cross-sectional diagram illustrating a buffer layer having been formed on a side of the epitaxial CZT(S,Se) layer opposite the epitaxial oxide interlayer according to an embodiment of the present invention.

Suitable materials for forming the buffer layer 502 include, but are not limited to, cadmium sulfide (CdS), a cadmium-zinc-sulfur material of the formula $Cd_{1-x}Zn_xS$ (wherein $0 < x \leq 1$), indium sulfide ($In_2S_3$), zinc oxide, zinc oxysulfide (e.g., a Zn(O,S) or Zn(O,S,OH) material), and aluminum oxide ($Al_2O_3$). According to an exemplary embodiment, the buffer layer 502 is formed on epitaxial kesterite CZT(S,Se) layer 402 using standard chemical bath deposition.

Figure 6:
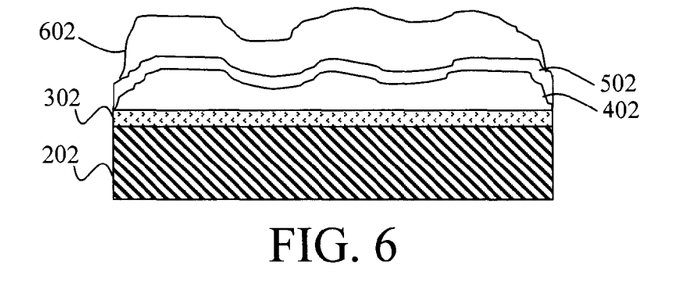
FIG. 6 is a cross-sectional diagram illustrating a transparent front contact having been formed on a side of the buffer layer opposite the epitaxial CZT(S,Se) layer according to an embodiment of the present invention.

Finally, as shown in FIG. 6, a transparent front contact 602 is formed on a side of the buffer layer 502 opposite the epitaxial kesterite CZT(S,Se) layer 402. Suitable materials for forming the transparent front contact 602 include, but are not limited to, transparent conductive oxides (TCO) such as indium-tin-oxide (ITO) and/or aluminum doped zinc oxide (AZO). According to an exemplary embodiment, the transparent front contact 602 is formed on the buffer layer 502 by sputtering.

Figure 7A:
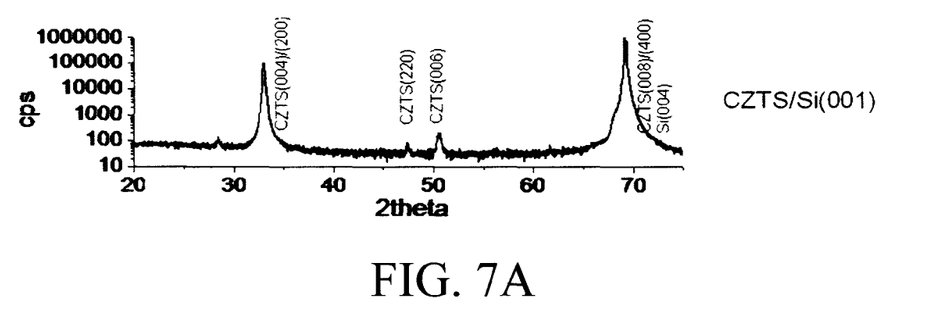
FIG. 7A is a diagram illustrating that a Si(001) starting substrate for the present process yields epitaxial CZT(S,Se) (004)/(200) and CZT(S,Se)(008)/(400) according to an embodiment of the present invention.

As provided above, according to the present techniques, the overall orientation of the epitaxial kesterite CZT(S,Se) material can be controlled by using different Si substrate orientations. This concept is further illustrated in FIGS. 7A and 7B. Specifically, as shown in FIG. 7A, when the starting substrate for the present process is a Si(001) substrate, then the epitaxial CZT(S,Se)(004)/(200) and CZT(S,Se)(008)/(400) peaks are visible in the x-ray diffraction pattern, indicating preferential alignment of the CZT(S,Se) in the same direction as the substrate. FIG. 7A is an x-ray diffraction pattern of epitaxial CZT(S,Se) produced (according to the present techniques) on a Si(001) substrate. In FIG. 7A, the diffraction angle is plotted on the x-axis and signal intensity (measured in counts per second (cps)) is plotted on the y-axis.

Figure 7B:
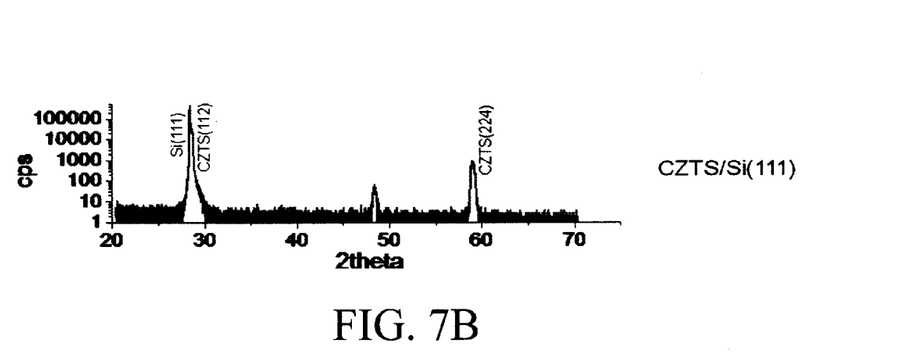
FIG. 7B is a diagram illustrating that a Si(111) starting substrate for the present process yields epitaxial CZT(S,Se) (112) according to an embodiment of the present invention.

By comparison, as shown in FIG. 7B, when the starting substrate for the present process is a Si(111) substrate, then the epitaxial CZT(S,Se)(112) peak is observed. FIG. 7B is an x-ray diffraction pattern of epitaxial CZT(S,Se) produced (according to the present techniques) on a Si(111) substrate. In FIG. 7B, the diffraction angle is plotted on the x-axis and signal intensity (measured in cps) is plotted on the y-axis.

Figure 8:
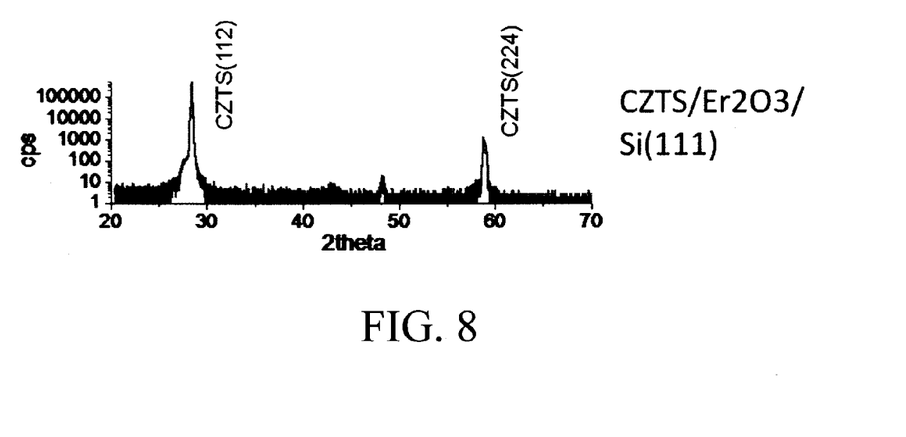
FIG. 8 is a diagram illustrating how with the inclusion of an epitaxial oxide interlayer between the epitaxial CZT(S,Se) and the Si substrate the CZT(S,Se) remains epitaxial to the underlying Si substrate according to an embodiment of the present invention.

The samples shown in FIGS. 7A and 7B were prepared without the epitaxial oxide interlayer. However, as shown in FIG. 8, with the inclusion of the present epitaxial oxide interlayer which is lattice-matched to Si and CZT(S,Se) (i.e., between the CZT(S,Se) and the Si substrate) the CZT(S,Se) layer is still epitaxial to the underlying Si substrate. Compare the spectrum in FIG. 8 with that shown in FIG. 7B, and described above. For illustrative purposes, only a sample formed on a Si(111) substrate is depicted in FIG. 8. However commensurate results would also be obtained with a Si(001) starting substrate. Further, the epitaxial oxide interlayer used in the example shown in FIG. 8 is $Er_2O_3$, however the same results would be obtained using any of the epitaxial oxide interlayer materials described herein. FIG. 8 is an x-ray diffraction pattern of epitaxial CZT(S,Se) produced (according to the present techniques) on a Si(111) substrate coated with an epitaxial oxide interlayer of $Er_2O_3$. In FIG. 8, the diffraction angle is plotted on the x-axis and signal intensity (measured in cps) is plotted on the y-axis.

Figure 9:
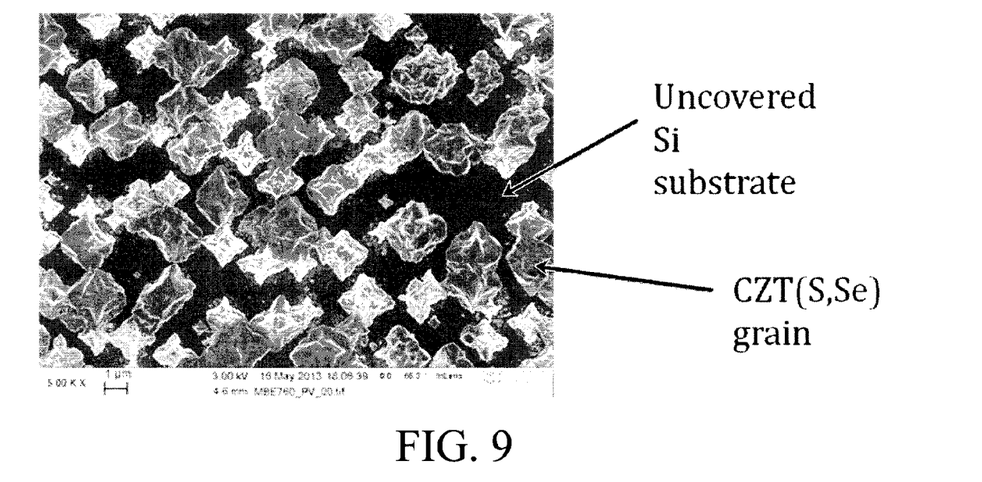
FIG. 9 is a diagram illustrating how epitaxial CZT(S,Se) films have difficulty wetting Si substrates according to an embodiment of the present invention.

As described above, epitaxial CZT(S,Se) films have difficulty wetting Si substrates. See FIG. 9. As shown in FIG. 9, there are uncovered portions of the Si substrate between the CZT(S,Se) grains. While growing a thicker film will improve the wetting, it would be ideal if wetting is improved without having to change the film thickness. Advantageously, use of the present epitaxial oxide interlayer enhances wettability of the CZT(S,Se) on Si, while permitting the CZT(S,Se) to remain epitaxial to the underlying Si substrate. See above.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming an epitaxial kesterite material, comprising the steps of:
   selecting a silicon (Si) substrate based on a crystallographic orientation of the Si substrate;
   forming an epitaxial oxide interlayer on the Si substrate to enhance wettability of the epitaxial kesterite material on the Si substrate, wherein the epitaxial oxide interlayer comprises a material that is lattice-matched to Si; and
   forming the epitaxial kesterite material on a side of the epitaxial oxide interlayer opposite the Si substrate, wherein the epitaxial kesterite material comprises copper (Cu), zinc (Zn), tin (Sn), and at least one of sulfur (S) and selenium (Se), wherein the epitaxial oxide interlayer is configured to prevent etching of the Si substrate during the step of forming of the epitaxial kesterite material, and wherein a crystallographic orientation of the epitaxial kesterite material is based on the crystallographic orientation of the Si substrate such that the crystallographic orientation of the epitaxial kesterite material is controlled by selecting the Si substrate having a particular crystallographic orientation.

2. The method of claim 1, further comprising the step of:
   selecting the Si substrate from one of a Si(001) substrate and a Si(111) substrate.

3. The method of claim 1, wherein the epitaxial oxide interlayer is formed having a thickness of from about 5 nanometers to about 30 nanometers, and ranges therebetween.

4. The method of claim 1, wherein the epitaxial oxide interlayer completely covers a surface of the Si substrate on which the epitaxial kesterite material is formed.

5. The method of claim 1, wherein the epitaxial oxide interlayer comprises erbium oxide ($Er_2O_3$), lanthanum oxide ($La_2O_3$), or yttrium oxide ($Y_2O_3$) each of which is lattice-matched to Si.

6. The method of claim 1, wherein the step of forming the epitaxial oxide interlayer and the step of forming the epitaxial kesterite material are performed by evaporation in a vacuum chamber in-situ without breaking vacuum between deposition of the epitaxial oxide interlayer and the epitaxial kesterite material.

7. The method of claim 6, further comprising the steps of:
   cleaning the Si substrate; and
   placing the Si substrate, once cleaned, in the vacuum chamber.

8. The method of claim 6, wherein the step of forming the epitaxial oxide interlayer is performed in the vacuum chamber at a pressure of from about $1 \times 10^{-6}$ Torr to about $1 \times 10^{-9}$ Torr, and ranges therebetween, at a temperature of from about 500° to about 750°, and ranges therebetween.

9. The method of claim 6, wherein the step of forming the epitaxial kesterite material is performed in the vacuum chamber at a pressure of from about $1 \times 10^{-6}$ Torr to about $1 \times 10^{-9}$ Torr, and ranges therebetween, at a temperature of from about 350° C. to about 550° C., and ranges therebetween.

10. A method of forming an epitaxial kesterite-based photovoltaic device, comprising the steps of:
   selecting a Si substrate based on a crystallographic orientation of the Si substrate;
   forming an epitaxial kesterite material on the Si substrate which serves as an absorber layer of the photovoltaic device, wherein the epitaxial kesterite material comprises Cu, Zn, Sn, and at least one of S and Se, and wherein a crystallographic orientation of the epitaxial kesterite material is based on the crystallographic orientation of the Si substrate such that the crystallographic orientation of the epitaxial kesterite material is controlled by selecting the Si substrate having a particular crystallographic orientation;
   forming a buffer layer on a side of the epitaxial kesterite material opposite the Si substrate; and
   forming a transparent front contact on a side of the buffer layer opposite the epitaxial kesterite material.

11. The method of claim 10, further comprising the step of:
forming an epitaxial oxide interlayer on the Si substrate such that the epitaxial oxide interlayer is present between the Si substrate and the epitaxial kesterite material, wherein the epitaxial oxide interlayer enhances wettability of the epitaxial kesterite material on the Si substrate, wherein the epitaxial oxide interlayer is configured to prevent etching of the Si substrate during the step of forming of the epitaxial kesterite material, and wherein the epitaxial oxide interlayer comprises a material that is lattice-matched to Si.

12. The method of claim 11, wherein the epitaxial oxide interlayer is formed having a thickness of from about 5 nanometers to about 30 nanometers, and ranges therebetween.

13. The method of claim 11, wherein the epitaxial oxide interlayer completely covers a surface of the Si substrate onto which the epitaxial kesterite material is formed.

14. The method of claim 11, wherein the epitaxial oxide interlayer comprises $Er_2O_3$, $La_2O_3$, or $Y_2O_3$ each of which is lattice-matched to Si.

15. The method of claim 10, further comprising the step of:
selecting the Si substrate from one of a Si(001) substrate and a Si(111) substrate.

16. The method of claim 10, wherein the buffer layer comprises cadmium sulfide (CdS), a cadmium-zinc-sulfur material of the formula $Cd_{1-x}Zn_xS$ (wherein $0<x\leq1$), indium sulfide ($In_2S_3$), zinc oxide, zinc oxysulfide, or aluminum oxide ($Al_2O_3$).

17. The method of claim 10, wherein the transparent front contact comprises at least one of indium-tin-oxide (ITO) and aluminum doped zinc oxide (AZO).

18. An epitaxial kesterite-based device, comprising:
a Si substrate;
an epitaxial oxide interlayer on the Si substrate, wherein the epitaxial oxide interlayer comprises a material that is lattice-matched to Si; and
an epitaxial kesterite material on a side of the epitaxial oxide interlayer opposite the Si substrate, wherein the epitaxial oxide interlayer serves to enhance wettability of the epitaxial kesterite material on the Si substrate, wherein the epitaxial kesterite material comprises Cu, Zn, Sn, and at least one of S and Se, wherein a crystallographic orientation of the epitaxial kesterite material is based on the crystallographic orientation of the Si substrate, and wherein the epitaxial oxide interlayer completely covers a surface of the Si substrate onto which the epitaxial kesterite material is formed and serves to prevent etching of the Si substrate.

19. The epitaxial kesterite-based device of claim 18, wherein the epitaxial oxide interlayer comprises $Er_2O_3$, $La_2O_3$, or $Y_2O_3$ each of which is lattice-matched to Si, and wherein the epitaxial oxide interlayer has a thickness of from about 5 nanometers to about 30 nanometers, and ranges therebetween.

20. The epitaxial kesterite-based device of claim 18, further comprising:
a buffer layer on a side of the epitaxial kesterite material opposite the Si substrate; and
a transparent front contact on a side of the buffer layer opposite the epitaxial kesterite material.

* * * * *